(12) United States Patent
Liu

(10) Patent No.: US 11,355,579 B2
(45) Date of Patent: Jun. 7, 2022

(54) DEVICE INTEGRATED WITH THREE-DIMENSIONAL MIM CAPACITOR AND METHOD FOR MAKING THE SAME

(71) Applicant: HUA HONG SEMICONDUCTOR (WUXI) LIMITED, Wuxi (CN)

(72) Inventor: Junwen Liu, Wuxi (CN)

(73) Assignee: Hua Hong Semiconductor (Wuxi) Limited, Wuxi (CN)

(*) Notice: Subject to any disclaimer, the term of this patent is extended or adjusted under 35 U.S.C. 154(b) by 0 days.

(21) Appl. No.: 16/999,498

(22) Filed: Aug. 21, 2020

(65) Prior Publication Data
US 2021/0193792 A1 Jun. 24, 2021

(30) Foreign Application Priority Data
Dec. 20, 2019 (CN) .......................... 201911324559.9

(51) Int. Cl.
*H01L 23/522* (2006.01)
*H01L 49/02* (2006.01)

(52) U.S. Cl.
CPC .......... *H01L 28/60* (2013.01); *H01L 23/5223* (2013.01)

(58) Field of Classification Search
CPC ............................ H01L 28/91; H01L 23/5223
See application file for complete search history.

(56) References Cited

U.S. PATENT DOCUMENTS

| | | | | |
|---|---|---|---|---|
| 2002/0185671 A1* | 12/2002 | Kim | .................... | H01L 23/5223 257/301 |
| 2005/0142737 A1* | 6/2005 | Park | .................... | H01L 21/7681 438/253 |
| 2009/0001437 A1* | 1/2009 | Won | .................. | H01L 21/76897 257/300 |
| 2018/0108651 A1* | 4/2018 | Kannan | ............... | H01L 23/5228 |

FOREIGN PATENT DOCUMENTS

WO          2019132939 A1     7/2019

OTHER PUBLICATIONS

Search Report issued in corresponding Chinese Patent Application No. 2019113245599, dated Mar. 22, 2021.

\* cited by examiner

*Primary Examiner* — Omar F Mojaddedi
(74) *Attorney, Agent, or Firm* — MKG, LLC

(57) ABSTRACT

The present application relates to the technical field of semiconductor manufacturing, in particular to a device integrated with a three-dimensional MIM capacitor and a method for manufacturing the same. The device comprising: a first dielectric layer, a first conductive metal structure being formed in the first dielectric layer; and a second dielectric layer, plurality of MIM capacitors being formed in the second dielectric layer, the bottom of each of the MIM capacitors being connected to the first conductive metal structure, and the plurality of three-dimensional MIM capacitors being arranged as array in a two-dimensional plane presented by the second dielectric layer; wherein each of the three-dimensional MIM capacitors sequentially com- (Continued)

prises an upper electrode, a dielectric layer covering the bottom sides of the upper electrode, and a lower electrode layer covering an outer surface of the dielectric layer; the lower electrode layer is connected to the first conductive metal structure.

4 Claims, 4 Drawing Sheets

DEVICE INTEGRATED WITH THREE-DIMENSIONAL MIM CAPACITOR AND METHOD FOR MAKING THE SAME

CROSS-REFERENCES TO RELATED APPLICATIONS

This application claims priority to Chinese patent application number 201911324559.9 filed at CNIPA on Dec. 20, 2019, and entitled "DEVICE INTEGRATED WITH THREE-DIMENSIONAL MIM CAPACITOR AND METHOD FOR MAKING THE SAME", the disclosure of which is incorporated by reference herein its entirely.

TECHNICAL FIELD

The present application relates to the technical field of semiconductor manufacturing, in particular, to a device integrated with a three-dimensional Metal-Insulator-Metal (MIM) capacitor.

BACKGROUND

With the development of Very-Large-Scale-Integrated-Circuits (VLSIC), the demand for capacitor density per unit area is growing. MIM capacitors are the key means for creating high-precision capacitors while a high level of device performance is ensured. The MIM capacitor is usually a sandwich structure, including an upper electrode layer and a lower electrode layer. A thin insulation layer is isolated between the upper electrode layer and the lower electrode layer.

In the related art, regarding the MIM capacitor, the capacitor occupying area per unit area is usually increased by expanding the lateral area of the capacitor. However, due to the limitation imposed by the size of the integrated circuit device, it becomes increasingly difficult for such the technical means to ensure the high level performance required by the integrated circuit.

BRIEF SUMMARY OF THE INVENTION

The present application provides a device integrated with a three-dimensional MIM capacitor and a method of forming it.

In one aspect, according to some embodiments in this disclosure, a device integrated with a three-dimensional MIM capacitor, including:

a first dielectric layer, a first conductive metal structure being formed in the first dielectric layer; and a second dielectric layer, a plurality of three-dimensional MIM capacitors being formed in the second dielectric layer, a bottom end of each of the three-dimensional MIM capacitors being connected to the first conductive metal structure, and the plurality of three-dimensional MIM capacitors being arranged as array layout in the second dielectric layer.

Wherein, from the inside out, each of the three-dimensional MIM capacitors sequentially comprises: an upper electrode, a dielectric layer covering the internal surface of the upper electrode, and a lower electrode layer covering the outside surface of the dielectric layer; the lower electrode layer is connected to the first conductive metal structure.

In some examples, the height of the upper electrode is greater than the width thereof.

In some examples, a constituent material of the lower electrode layer comprises titanium nitride.

In some examples, a constituent material of the dielectric layer comprises silicon nitride.

In some examples, the device further comprises: a second conductive metal structure and a third dielectric layer;

the second conductive metal structure being formed in the second dielectric layer; the bottom of the second conductive metal structure being connected to the first conductive metal structure;

the third dielectric layer being formed on the second dielectric layer, an upper electrode lead structure and a lower electrode lead structure being formed in the third dielectric layer; a bottom end of the upper electrode lead structure being connected to the upper electrode at a corresponding position; a bottom end of the lower electrode lead structure being connected to the second conductive metal structure;

wherein constituent materials of the upper electrode, the first conductive metal structure, and the second conductive metal structure comprise copper.

In some examples, the second conductive metal structure comprises a copper conductive hole having a bottom end connected to the first conductive metal structure and a copper conductive lead connected to the copper conductive hole.

In some examples, the lower electrode lead structure comprises a copper conductive through hole having a bottom end connected to the second conductive metal structure and a copper conductive lead connected to a top end of the copper conductive through hole.

In some examples, the upper electrode lead structure comprises a plurality of copper conductive through holes and a copper conductive lead, a bottom end of each of the copper conductive through holes is respectively connected to a corresponding upper electrode, and the plurality of copper conductive through holes are all connected to the copper conductive lead.

In some examples, the device further comprises:

a second conductive metal structure through hole, the second conductive metal structure through hole being formed in the second dielectric layer, and a bottom end of the second conductive metal structure through hole being connected to the first conductive metal structure;

a third dielectric layer, the third dielectric layer being formed on the second dielectric layer, a plurality of conductive leads being formed in the third dielectric layer, and a bottom end of each of the conductive leads being connected to the upper electrode at a corresponding position;

a fourth dielectric layer, the fourth dielectric layer being formed on the third dielectric layer, a plurality of upper electrode conductive through holes being formed in the fourth dielectric layer, and a bottom end of each of the upper electrode conductive through holes being connected to a second conductive metal structure lead at a corresponding position; and a fifth dielectric layer, the fifth dielectric layer being formed on the fourth dielectric layer, a plurality of upper electrode conductive leads being formed in the fifth dielectric layer, the bottom of each of the upper electrode conductive leads being connected to an upper end of the upper electrode conductive through hole at a corresponding position;

wherein constituent materials of the first conductive metal structure, the conductive lead, and the upper electrode conductive lead comprise aluminum; and constituent materials of the upper electrode, the second conductive metal structure through hole, and the upper electrode conductive through hole comprise tungsten.

In some examples, the second conductive metal structure lead is formed on the third dielectric layer, and a bottom end of the second conductive metal structure lead is connected to the second conductive metal structure through hole;

a lower electrode conductive through hole is formed on the fourth dielectric layer, and a bottom end of the lower electrode conductive through hole is connected to the second conductive metal structure lead;

a lower electrode conductive lead is formed on the fifth dielectric layer, and a bottom end of the lower electrode conductive lead is connected to the lower electrode conductive through hole; and wherein constituent materials of the second conductive metal structure lead and the lower electrode conductive lead comprise aluminum; and a constituent material of the lower electrode conductive through hole comprises tungsten.

In another aspect, according to some embodiments in this disclosure, a method for making the device integrated with three-dimensional MIM capacitor, comprising:

providing a first dielectric layer, a first conductive metal structure being formed in the first dielectric layer;

forming a second dielectric layer on the first dielectric layer;

forming a plurality of first through holes in the second dielectric layer by means of etching, the plurality of first through holes being arranged in an array at intervals in a two-dimensional plane presented by the second dielectric layer, to expose the first conductive metal structure;

forming a lower electrode layer on the surfaces of the second dielectric layer and the first through hole, the lower electrode layer covering a bottom surface and a side surface of the first through hole, and a bottom end of the lower electrode layer being connected to the first conductive metal structure;

forming a dielectric layer on the surface of the lower electrode layer;

filling the first through hole with metal to form an upper electrode, the upper electrode, the dielectric layer, and a lower electrode in the first through hole constituting a three-dimensional MIM capacitor; and removing the lower electrode layer, the dielectric layer, and the metal outside the first through hole by means of a planarization process.

In some examples, the height of the first through hole is greater than the width thereof.

In some examples, after the forming a dielectric layer on the surface of the lower electrode layer, the method further comprises:

forming a second through hole in the second dielectric layer by means of photolithography and etching, to expose the first conductive metal structure; and forming a first trench in the second through hole by means of photolithography and etching, an upper end of the second through hole communicating with the first trench;

wherein the filling the first through hole with metal to form an upper electrode comprises:

performing copper plating in the first through hole, the second through hole, and the trench, to form the upper electrode and a second conductive metal structure, respectively.

In some examples, after the removing the lower electrode layer, the dielectric layer, and the metal outside the first through hole by means of a planarization process, the method further comprises:

forming a third dielectric layer on the second dielectric layer; and forming an upper electrode lead structure and a lower electrode lead structure in the third dielectric layer, a bottom end of the upper electrode lead structure being connected to the upper electrode at a corresponding position, and a bottom end of the lower electrode lead structure being connected to the second conductive metal structure.

In some examples, after the forming a dielectric layer on the surface of the lower electrode layer, the method further comprises:

forming a second through hole in the second dielectric layer by means of photolithography and etching, to expose the first conductive metal structure;

wherein the filling the first through hole with metal to form an upper electrode comprises:

filling the first through hole and the second through hole with tungsten by means of a PVD process, to form the upper electrode and a second conductive metal structure through hole, respectively.

In some examples, after the removing the lower electrode layer, the dielectric layer, and the metal outside the first through hole by means of a planarization process, the method further comprises:

forming a third dielectric layer on the second dielectric layer;

forming a second conductive metal structure lead and a plurality of conductive leads in the third dielectric layer, a bottom end of the second conductive metal structure lead being connected to the second conductive metal structure through hole, and a bottom end of each of the conductive leads being connected to the upper electrode at a corresponding position;

forming a fourth dielectric layer on the third dielectric layer;

forming a lower electrode conductive through hole and a plurality of upper electrode conductive through holes in the fourth dielectric layer, a bottom end of the lower electrode conductive through hole being connected to the second conductive metal structure lead, and a bottom end of each of the upper electrode conductive through holes being connected to the second conductive metal structure lead at a corresponding position;

forming a fifth dielectric layer on the fourth dielectric layer; and forming a lower electrode conductive lead and a plurality of upper electrode conductive leads in the fifth dielectric layer, a bottom end of the lower electrode conductive lead being connected to the lower electrode conductive through hole, and the bottom of the upper electrode conductive lead being connected to an upper end of each of the upper electrode conductive through holes;

wherein constituent materials of the conductive lead, the upper electrode conductive lead, and the lower electrode conductive lead comprise aluminum; and constituent materials of the upper electrode conductive through hole and the lower electrode conductive through hole comprise tungsten.

The technical solution of the present application comprises at least the following advantages:

since a plurality of three-dimensional MIM capacitors are integrated in the second dielectric layer, when the capacitor density per unit area needs to be increased, on the one hand, the number of the three-dimensional MIM capacitors can be increased, on the other hand, the height of the three-dimensional MIM capacitors can be increased, so that the capacitor density per unit area can be increased without changing the two-dimensional device size, thereby avoiding limitation imposed by the two-dimensional device size, and ensuring the high level performance required by an integrated circuit.

BRIEF DESCRIPTION OF THE DRAWINGS

In order to more clearly explain the specific implementations of the present application or the technical solutions in the prior art, the drawings required in description of the specific implementations or the prior art will be briefly described below. It is obvious that the drawings described below are some implementations of the present application, and one skilled in the art could also obtain other drawings on the basis of these drawings without creative work.

DETAILED DESCRIPTION OF PREFERRED EMBODIMENTS OF THE INVENTION

Figure 1:
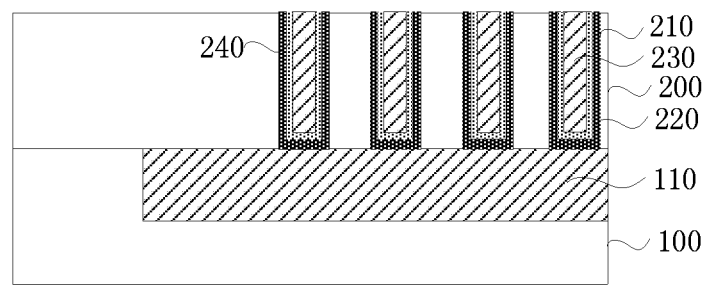
FIG. 1 illustrates a sectional diagram of a device integrated with a three-dimensional MIM capacitor provided in an exemplary embodiment of the present application.

The technical solution of the present application will be clearly and completely described below with reference to the drawings. Obviously, the described embodiments are part of the embodiments of the present application, instead of all of them. Based on the embodiments in the present application, all other embodiments obtained by one skilled in the art without contributing any inventive labor shall fall into the protection scope of the present application.

In the description of the present application, it should be noted that the orientation or position relationship indicated by the terms "center", "upper", "lower", "left", "right", "vertical", "horizontal", "inner", "outer", etc. is based on the orientation or position relationship shown in the drawings, intended only for the convenience of describing the present application and simplifying the description, rather than indicating or implying that the device or element referred to necessarily has a specific orientation or is configured or operated in a specific orientation, and thus cannot be construed as a limitation on the present application. In addition, the terms "first", "second", and "third" are used for descriptive purposes only, and cannot be construed as indicating or implying relative importance.

In the description of the present application, it should be noted that, unless otherwise clearly specified and limited, the terms "mounting", "coupling", and "connecting" should be understood in a broad sense, for example, a connection can be a fixed connection, a detachable connection, or an integrated connection, can be a mechanical connection or an electrical connection, can be a direct connection, an indirect connection implemented by means of an intermedium, or an internal connection between two components, and can be a wireless connection or a wired connection. A person skilled in the art could understand the specific meanings of the above terms in the present application on the basis of specific situations.

In addition, the technical features involved in different embodiments of the present application described below can be combined with each other in the case of no conflict.

Exemplary Embodiment 1

FIG. 1 shows a sectional diagram of a device integrated with a three-dimensional MIM capacitor provided in an exemplary embodiment of the present application. Referring to FIG. 1, the device includes:

a first dielectric layer 100, wherein a first conductive metal structure 110 is formed in the first dielectric layer 100, and a constituent material of the first conductive metal structure 110 includes copper (Cu); and a second dielectric layer 200, wherein a plurality of three-dimensional MIM capacitors 210 are formed in the second dielectric layer 200, the plurality of three-dimensional MIM capacitors 210 being arranged as array layout in the second dielectric layer 200, and a bottom end of each of the three-dimensional MIM capacitors 210 is connected to the first conductive metal structure 110.

Each of the three-dimensional MIM capacitors 210 sequentially includes an upper electrode 230, a dielectric layer 240 covering a bottom surface and a side surface of the upper electrode 230, and a lower electrode layer 220 covering an outer surface of the dielectric layer from the inside out, and the lower electrode layer 220 is connected to the first conductive metal structure 110, to facilitate leading out a lower electrode lead of the three-dimensional MIM capacitor 210 from the first conductive metal structure 110. Optionally, the height of the upper electrode 230 is greater than the width thereof. Exemplarily, the upper electrode 230 can be a three-dimensional structure such as a cylinder, a cube, a cone, and a truncated cone.

Optionally, a constituent material of the lower electrode layer 220 includes titanium nitride (TiN); a constituent material of the upper electrode 230 includes copper; and a constituent material of the dielectric layer 240 includes silicon nitride (SiN).

When the capacitor density per unit area needs to be increased, on the one hand, the number of the three-dimensional MIM capacitors 210 can be increased, on the other hand, the height of the three-dimensional MIM capacitors 210 can be increased, so that the capacitor density per unit area can be increased without changing the two-dimensional device size, thereby avoiding limitation imposed by the two-dimensional device size, and ensuring the high level performance required by a device.

Exemplary Embodiment 2

Figure 2:
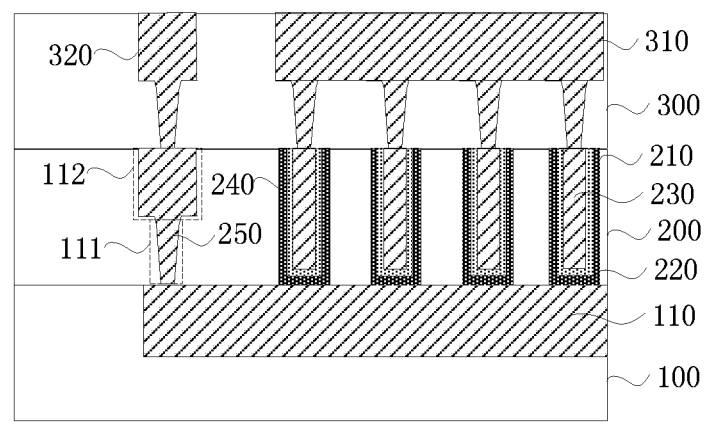
FIG. 2 illustrates a sectional diagram of a device integrated with a three-dimensional MIM capacitor provided in an exemplary embodiment of the present application.

FIG. 2 shows a sectional diagram of a device integrated with a three-dimensional MIM capacitor provided in an exemplary embodiment of the present application. Referring to FIG. 2, on the basis of exemplary embodiment 1, the device further includes:

a second conductive metal structure 250 formed in the second dielectric layer 200 and having a bottom end connected to the first conductive metal structure 110; and a third dielectric layer 300 formed on the second dielectric layer 200, wherein an upper electrode lead structure 310 and a lower electrode lead structure 320 are formed in the third dielectric layer 300, a bottom end of the upper electrode lead structure 310 is connected to the upper electrode 230 at a corresponding position, and a bottom end of the lower electrode lead structure 320 is connected to the second conductive metal structure 250.

The second conductive metal structure 250 includes a copper conductive hole 111 having a bottom end connected to the first conductive metal structure 110 and a copper conductive lead 112 connected to the copper conductive hole.

The lower electrode lead structure 320 includes a copper conductive through hole having a bottom end connected to the second conductive metal structure 250 and a copper conductive lead connected to a top end of the copper conductive through hole.

The upper electrode lead structure 310 includes a plurality of copper conductive through holes, a bottom end of each of the copper conductive through holes is respectively connected to the upper electrode 230 of a corresponding three-dimensional MIM capacitor 210, and the plurality of copper conductive through holes are all connected to the same copper conductive lead. It can be understood that, a plurality of three-dimensional MIM capacitors 210 can be connected to each other by means of the upper electrode lead structure 310, thereby implementing integration of the three-dimensional MIM capacitors 210.

Due to the technical means of copper interconnection, the upper electrodes 230 of the three-dimensional MIM capacitors 210 are electrically connected to each other by means of the upper electrode lead structure 310, and the lower electrode layers 220 of the three-dimensional MIM capacitors 210 are electrically connected to each other by means of an interconnection structure of the first conductive metal structure 110, the second conductive metal structure 250, and the lower electrode lead structure 320, so as to ensure the device performance while enlargement of the device size is avoided as much as possible.

Exemplary Embodiment 3

Figure 3:
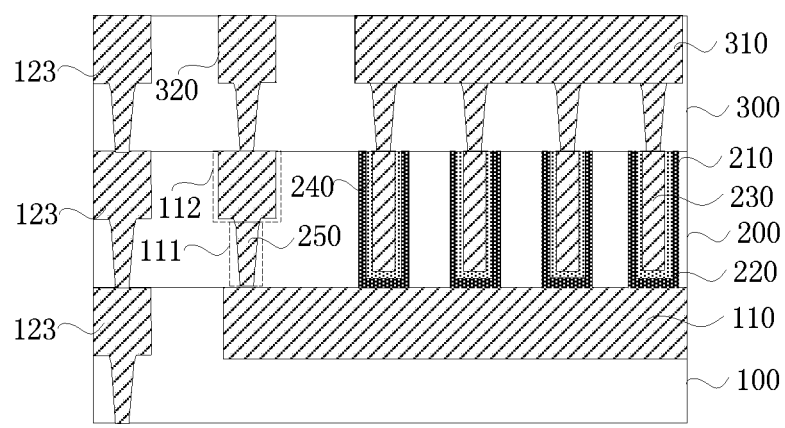
FIG. 3 illustrates a sectional diagram of a device integrated with a three-dimensional MIM capacitor provided in an exemplary embodiment of the present application.

FIG. 3 shows a sectional diagram of a device integrated with a three-dimensional MIM capacitor provided in an exemplary embodiment of the present application. Referring to FIG. 3, on the basis of exemplary embodiment 2, the device further includes:

other conductive metal structure 123 formed in the first dielectric layer 100, the second dielectric layer 200, and the third dielectric layer 300, wherein the other conductive metal structure 123 includes interconnected copper conductive through hole and copper conductive lead, and other conductive metal structure 123 in each dielectric layer is connected to other conductive metal structure 123 at a corresponding position in an upper layer, and/or other conductive metal structure 123 in a lower layer.

Exemplary Embodiment 4

Figure 4:
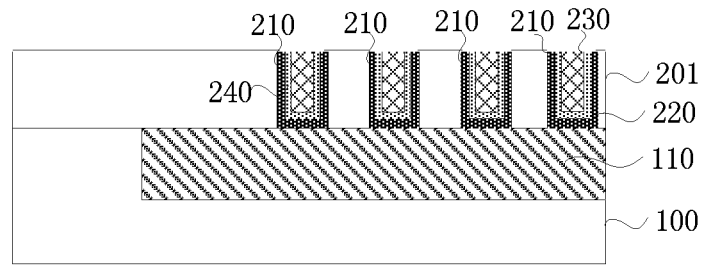
FIG. 4 illustrates a sectional diagram of a device integrated with a three-dimensional MIM capacitor provided in an exemplary embodiment of the present application.

FIG. 4 shows a sectional diagram of a device integrated with a three-dimensional MIM capacitor provided in an exemplary embodiment of the present application. Referring to FIG. 4, the device includes:

a first dielectric layer 100, wherein a first conductive metal structure 110 is formed in the first dielectric layer 100, the first conductive metal structure 110 is located at an upper portion of the first dielectric layer 100, and a constituent material of the first conductive metal structure 110 includes aluminum (Al); and a second dielectric layer 200, wherein a plurality of three-dimensional MIM capacitors 210 are formed in the second dielectric layer 200, the plurality of three-dimensional MIM capacitors 210 being arranged in an array at intervals in a two-dimensional plane presented by the second dielectric layer 200, and a bottom end of each of the three-dimensional MIM capacitors 210 is connected to the first conductive metal structure 110.

Each of the three-dimensional MIM capacitors 210 sequentially includes an upper electrode 230, a dielectric layer 240 covering a bottom surface and a side surface of the upper electrode 230, and a lower electrode layer 220 covering an outer surface of the dielectric layer from the inside out, and the lower electrode layer 220 is connected to the first conductive metal structure 110, to facilitate leading out a lower electrode lead of the three-dimensional MIM capacitor 210 from the first conductive metal structure 110. Optionally, the height of the upper electrode 230 is greater than the width thereof. Exemplarily, the upper electrode 230 can be a three-dimensional structure such as a cylinder, a cube, a cone, and a truncated cone.

Optionally, a constituent material of the lower electrode layer 220 includes titanium nitride; a constituent material of the upper electrode 230 includes tungsten (W); and a constituent material of the dielectric layer 240 includes silicon nitride.

When the capacitor density per unit area needs to be increased, on the one hand, the number of the three-dimensional MIM capacitors 210 can be increased, on the other hand, the height of the three-dimensional MIM capacitors 210 can be increased, so that the capacitor density per unit area can be increased without changing the two-dimensional device size, thereby avoiding limitation imposed by the two-dimensional device size, and ensuring the high level performance required by a device.

Exemplary Embodiment 5

Figure 5:
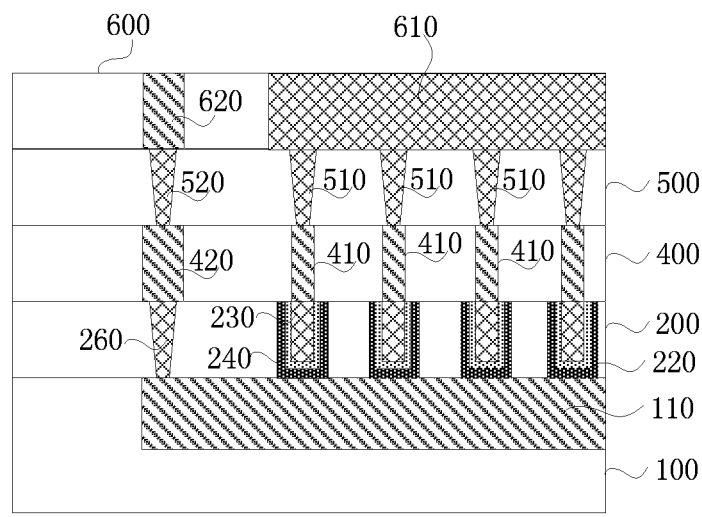
FIG. 5 illustrates a sectional diagram of a device integrated with a three-dimensional MIM capacitor provided in an exemplary embodiment of the present application.

FIG. 5 shows a sectional diagram of a device integrated with a three-dimensional MIM capacitor provided in an exemplary embodiment of the present application. Referring to FIG. 5, on the basis of exemplary embodiment 4, the device further includes:

a second conductive metal structure through hole 260 formed in the second dielectric layer 200 and having a bottom end connected to the first conductive metal structure 110, wherein, optionally, a constituent material of the second conductive metal structure through hole 260 includes tungsten;

a third dielectric layer 400 formed on the second dielectric layer 200, wherein a plurality of conductive leads 410 are formed in the third dielectric layer, and a bottom end of each of the conductive leads 410 is connected to the upper electrode 230 at a corresponding position, a second conductive metal structure lead 420 is formed in the third dielectric layer 400, and a bottom end of the second conductive metal structure lead 420 is connected to the second conductive metal structure through hole 260;

a fourth dielectric layer 500 formed on the third dielectric layer 400, wherein a plurality of upper electrode conductive through holes 510 are formed in the fourth dielectric layer 500, a bottom end of each of the upper electrode conductive through holes 510 is connected to the second conductive metal structure lead 420 at a corresponding position, a lower electrode conductive through hole 520 is formed in the fourth dielectric layer 500, and a bottom end of the lower electrode conductive through hole 520 is connected to the second conductive metal structure lead 420; and a fifth dielectric layer 600 formed on the fourth dielectric layer 500, wherein a plurality of upper electrode conductive leads 610 are formed in the fifth dielectric layer 600, the bottom of each of the upper electrode conductive leads 610 is connected to an upper end of each upper electrode conductive through hole 510, a lower electrode conductive lead 620 is formed in the fifth dielectric layer 600, and a bottom end of the lower electrode conductive lead 620 is connected to the lower electrode conductive through hole 520.

It should be noted that, the interconnected conductive lead 410, upper electrode conductive through hole 510, and upper electrode conductive lead 610 form an upper electrode lead structure; and the interconnected second conductive metal structure through hole 260, second conductive metal structure lead 420, lower electrode conductive through hole 520, and lower electrode conductive lead 620 form a lower electrode lead structure.

Constituent materials of the conductive lead 410, the second conductive metal structure lead 420, the upper electrode conductive lead 610, and the lower electrode conductive lead 620 include aluminum; and constituent materials of the upper electrode conductive through hole 510 and the lower electrode conductive through hole 520 include tungsten.

Exemplary Embodiment 6

Figure 6:
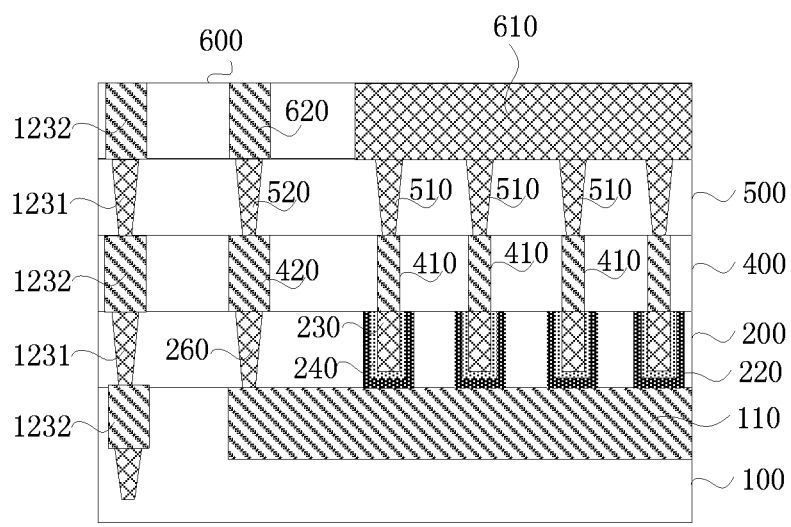
FIG. 6 illustrates a sectional diagram of a device integrated with a three-dimensional MIM capacitor provided in an exemplary embodiment of the present application.

FIG. 6 shows a sectional diagram of a device integrated with a three-dimensional MIM capacitor provided in an exemplary embodiment of the present application. Referring to FIG. 6, on the basis of exemplary embodiment 5, the device further includes:

other conductive metal structure formed in the first dielectric layer 100, the second dielectric layer 200, the third dielectric layer 400, the fourth dielectric layer 500, and the fifth dielectric layer 600, wherein the other conductive metal structure includes sequentially interconnected tungsten conductive through hole 1231 and aluminum conductive lead 1232 from the bottom up, and other conductive metal structure in each dielectric layer is connected to other conductive metal structure at a corresponding position in an upper layer, and/or other conductive metal structure in a lower layer.

Exemplary Embodiment 7

Figure 7:
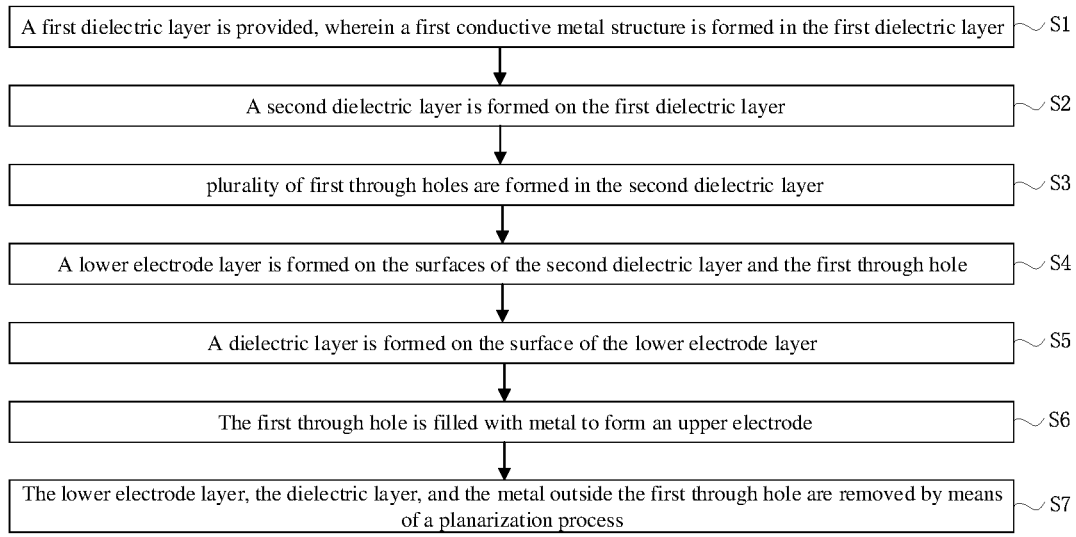
FIG. 7 illustrates a flow chart of a three-dimensional MIM capacitor integration method provided in an exemplary embodiment of the present application.

Referring to FIG. 7, which shows a flow chart of a three-dimensional MIM capacitor integration method provided in an exemplary embodiment of the present application, the method can be used to manufacture the device in exemplary embodiments 1 and 4, and the method includes the following steps:

Step S1: A first dielectric layer is provided, wherein a first conductive metal structure is formed in the first dielectric layer.

Step S2: A second dielectric layer is formed on the first dielectric layer.

Step S3: A plurality of first through holes are formed in the second dielectric layer, wherein the plurality of first through holes are arranged in an array at intervals in a two-dimensional plane presented by the second dielectric layer, to expose the first conductive metal structure.

Exemplarily, the plurality of first through holes can be formed in the second dielectric layer by means of photolithography and etching.

Step S4: A lower electrode layer is formed on the surfaces of the second dielectric layer and the first through hole, wherein the lower electrode layer covers a bottom surface and a side surface of the first through hole, and a bottom end of the lower electrode layer is connected to the first conductive metal structure.

Optionally, a constituent material of the lower electrode layer includes titanium nitride.

Step S5: A dielectric layer is formed on the surface of the lower electrode layer.

Optionally, a constituent material of the dielectric layer includes silicon nitride.

Step S6: The first through hole is filled with metal to form an upper electrode, wherein the upper electrode, the dielectric layer, and a lower electrode in the first through hole constitute a three-dimensional MIM capacitor.

Optionally, the height of the first through hole is greater than the width thereof. Exemplarily, the first through hole can be a three-dimensional structure such as a cylinder, a cube, a cone, and a truncated cone.

Step S7: The lower electrode layer, the dielectric layer, and the metal outside the first through hole are removed by means of a planarization process.

Exemplary Embodiment 8

The method provided in this embodiment is an optional implementation of exemplary embodiment 7, and can be used to manufacture the device in exemplary embodiment 2. Referring to exemplary embodiment 7 and FIG. 2, the metal for filling in step S6 in this embodiment includes copper, and a constituent material of the first conductive metal structure includes copper. After step S5 and before step S6, the method further includes the following steps:

a second through hole is formed in the second dielectric layer by means of photolithography and etching, to expose the first conductive metal structure; and a first trench is formed in the second through hole by means of photolithography and etching, wherein an upper end of the second through hole communicates with the first trench.

The "filling the first through hole with metal to form an upper electrode" in step S6 includes but is not limited to: performing copper plating in the first through hole, the second through hole, and the trench, to form the upper electrode and a second conductive metal structure, respectively.

A bottom end of the second conductive metal structure is connected to the first conductive metal structure, copper plating is performed in the second through hole to form a copper conductive through hole, and copper plating is formed in the first trench to form a copper conductive lead.

Exemplary Embodiment 9

Figure 8:
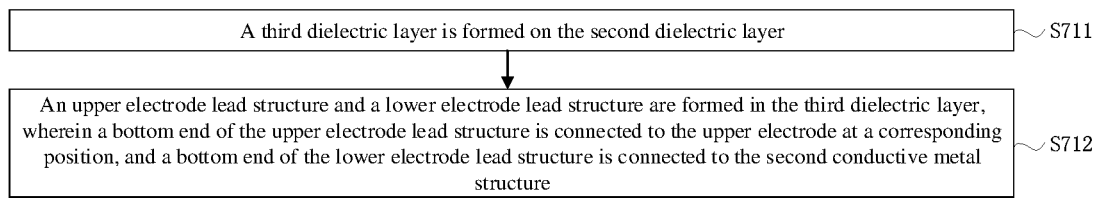
FIG. 8 illustrates a flow chart of a three-dimensional MIM capacitor integration method provided in an exemplary embodiment of the present application.

Referring to FIG. 8, which shows a flow chart of a three-dimensional MIM capacitor integration method provided in an exemplary embodiment of the present application, the method is an optional implementation of exemplary embodiment 8, and can be used to manufacture the device in exemplary embodiment 2. The method can be performed after step S7, and includes the following steps:

Step S711: A third dielectric layer is formed on the second dielectric layer.

Step S712: An upper electrode lead structure and a lower electrode lead structure are formed in the third dielectric layer, wherein a bottom end of the upper electrode lead structure is connected to the upper electrode at a corresponding position, and a bottom end of the lower electrode lead structure is connected to the second conductive metal structure.

Exemplary Embodiment 10

The method provided in this embodiment is an optional implementation of exemplary embodiment 9, and can be used to manufacture the device in exemplary embodiment 3. Referring to exemplary embodiment 9 and FIG. 3, in this embodiment:

other conductive metal structure is formed in the first dielectric layer, the second dielectric layer, and the third dielectric layer, wherein the other conductive metal structure includes interconnected copper conductive through hole and copper conductive lead, and other conductive metal structure in each dielectric layer is connected to other conductive metal structure at a corresponding position in an upper layer, and/or other conductive metal structure in a lower layer.

Exemplary Embodiment 11

The method provided in this embodiment is an optional implementation of exemplary embodiment 7, and can be used to manufacture the device in exemplary embodiment 4. Referring to exemplary embodiment 7 and FIG. 4, in this embodiment, the metal for filling in step S6 in this embodiment includes tungsten, and a constituent material of the first conductive metal structure includes aluminum. After step S3 and before step S6, the method further includes the following step:

a second through hole is formed in the second dielectric layer by means of photolithography and etching, to expose the first conductive metal structure.

The "filling the first through hole with metal to form an upper electrode" in step S6 includes but is not limited to: filling the first through hole and the second through hole with tungsten by means of a physical vapor deposition (PVD) process, to form the upper electrode and a second conductive metal structure through hole, respectively Exemplary Embodiment 12

Figure 9:
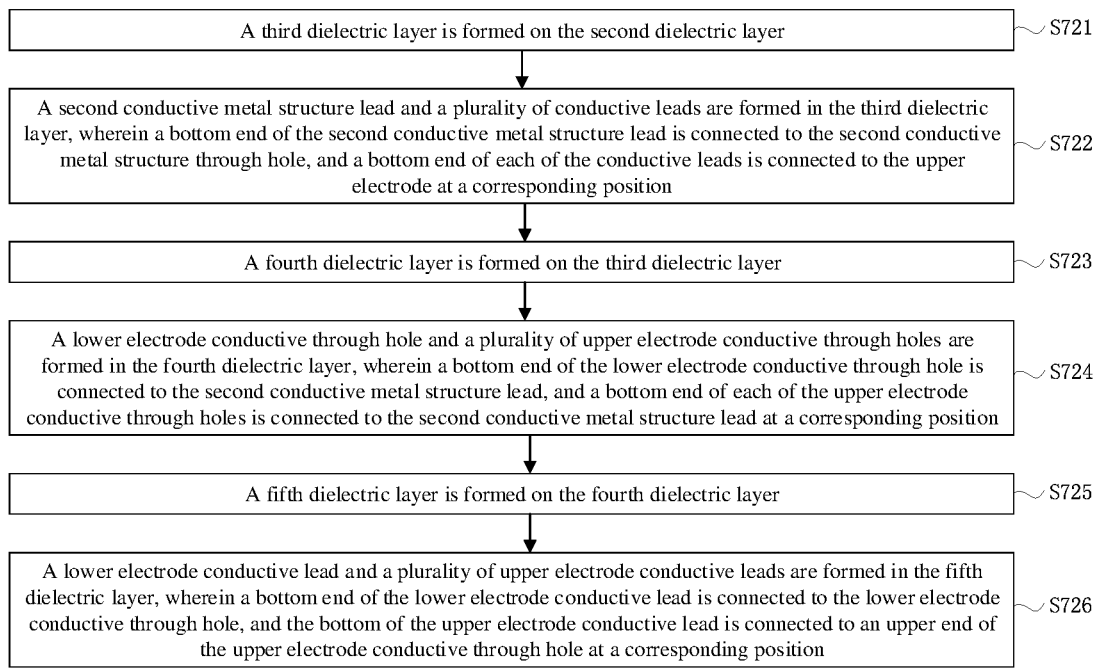
FIG. 9 illustrates a flow chart of a three-dimensional MIM capacitor integration method provided in an exemplary embodiment of the present application.

Referring to FIG. 9, which shows a flow chart of a three-dimensional MIM capacitor integration method provided in an exemplary embodiment of the present application, the method is an optional implementation of exemplary embodiment 11, and can be used to manufacture the device in exemplary embodiment 5. The method can be performed after step S7, and includes the following steps.

Step S721: A third dielectric layer is formed on the second dielectric layer.

Step S722: A second conductive metal structure lead and a plurality of conductive leads are formed in the third dielectric layer, wherein a bottom end of the second conductive metal structure lead is connected to the second conductive metal structure through hole, and a bottom end of each of the conductive leads is connected to the upper electrode at a corresponding position.

Optionally, constituent materials of the second conductive metal structure lead and the conductive lead include aluminum. Trenches corresponding to the second conductive metal structure lead and the plurality of conductive leads can be formed in the third dielectric layer by means of photolithography and etching; and aluminum plating is performed in the trenches corresponding to the second conductive metal structure lead and the plurality of conductive leads, to form the second conductive metal structure lead and the plurality of conductive leads by means of a planarization process.

Step S723: A fourth dielectric layer is formed on the third dielectric layer.

Step S724: A lower electrode conductive through hole and a plurality of upper electrode conductive through holes are formed in the fourth dielectric layer, wherein a bottom end of the lower electrode conductive through hole is connected to the second conductive metal structure lead, and a bottom end of each of the upper electrode conductive through holes is connected to the second conductive metal structure lead at a corresponding position.

Optionally, constituent materials of the lower electrode conductive through hole and the upper electrode conductive through hole include tungsten. Through holes corresponding to the lower electrode conductive through hole and the plurality of upper electrode conductive through holes can be formed in the fourth dielectric layer by means of photolithography and etching; and tungsten is deposited in the through holes corresponding to the lower electrode conductive through hole and the plurality of upper electrode conductive through holes by means of a PVD process, to form the lower electrode conductive through hole and the plurality of upper electrode conductive through holes by means of a planarization process.

Step S725: A fifth dielectric layer is formed on the fourth dielectric layer.

Step S726: A lower electrode conductive lead and a plurality of upper electrode conductive leads are formed in the fifth dielectric layer, wherein a bottom end of the lower electrode conductive lead is connected to the lower electrode conductive through hole, and the bottom of the upper electrode conductive lead is connected to an upper end of the upper electrode conductive through hole at a corresponding position.

Optionally, constituent materials of the lower electrode conductive lead and the upper electrode conductive leads include aluminum. Trenches corresponding to the lower electrode conductive lead and the plurality of upper electrode conductive leads can be formed in the fifth dielectric layer by means of photolithography and etching; and aluminum plating is performed in the trenches corresponding to the lower electrode conductive lead and the plurality of upper electrode conductive leads, to form the lower electrode conductive lead and the plurality of upper electrode conductive leads by means of a planarization process.

Exemplary Embodiment 13

The method provided in this embodiment is an optional implementation of exemplary embodiment 12, and can be used to manufacture the device in exemplary embodiment 6. Referring to exemplary embodiment 12 and FIG. 6, in this embodiment, the method further includes a step of forming other conductive metal structure in the first dielectric layer, the second dielectric layer, the third dielectric layer, the fourth dielectric layer, and the fifth dielectric layer.

The other conductive metal structure includes sequentially interconnected tungsten conductive through hole and aluminum conductive lead from the bottom up, and other conductive metal structure in each dielectric layer is connected to other conductive metal structure at a corresponding position in an upper layer, and/or other conductive metal structure in a lower layer.

Obviously, the above embodiments are merely examples used for clear description, rather than for limitation on the implementations. A person skilled in the art could also make other changes or modifications in different forms on the basis of the above description. There is no need and way to exhaustively list all of the implementations herein, but obvious changes or modification derived herefrom still fall within the protection scope created by the present application.

What is claimed is:

1. A three-dimensional MIM capacitor integration method, comprising:
   providing a first dielectric layer, a first conductive metal structure being formed in the first dielectric layer;
   forming a second dielectric layer on the first dielectric layer;
   forming a plurality of first contact holes in the second dielectric layer by means of etching, the plurality of first contact holes being arranged in an array at intervals in a two-dimensional plane presented by the second dielectric layer, to expose the first conductive metal structure, wherein the height of each of the plurality of first contact holes is greater than the respective width thereof;
   forming a bottom electrode layer within each of the plurality of first contact holes, the bottom electrode layer covering a bottom surface and a side surface of each of the plurality of first contact holes, and a bottom end of the bottom electrode layer of each of the first contact holes being connected to the first conductive metal structure;
   forming a dielectric layer on the surface of each bottom electrode layer;
   forming a second contact hole in the second dielectric layer by means of photolithography and etching, to expose the first conductive metal structure; and forming a first trench in the second contact hole by means of photolithography and etching, an upper end of the second contact hole communicating with the first trench;
   performing copper plating in the plurality of first contact holes to form a respective upper electrode,
   performing copper plating in the second contact hole and the first trench to form a second conductive metal structure being connected to the first conductive metal structure;
   the upper electrode, the dielectric layer, and the bottom electrode layer formed in each of the plurality of first contact holes constituting a plurality of three-dimensional MIM capacitors being connected to the first conductive metal structure; and
   removing the bottom electrode layer, the dielectric layer, and the copper disposed outside the plurality of first contact holes by means of a planarization process.

2. The method according to claim 1, after the removing the bottom electrode layer, the dielectric layer, and the copper disposed outside the plurality of first contact holes by means of a planarization process, further comprising:
   forming a third dielectric layer on the second dielectric layer; and
   forming an upper electrode lead structure and a bottom electrode lead structure in the third dielectric layer, a bottom end of the upper electrode lead structure being connected to the upper electrodes at a corresponding position, and a bottom end of the bottom electrode lead structure being connected to the second conductive metal structure.

3. The method according to claim 1, further comprising:
   filling the plurality of first contact holes and the second contact hole with tungsten by means of a PVD process, to form the upper electrodes and the second conductive metal structure, respectively.

4. The method according to claim 3, after the removing the bottom electrode layer, the dielectric layer, and the copper disposed outside the plurality of first contact holes by means of a planarization process, further comprising:
   forming a third dielectric layer on the second dielectric layer;
   forming a second conductive metal structure lead and a plurality of conductive leads in the third dielectric layer, a bottom end of the second conductive metal structure lead being connected to the second conductive metal structure, and a bottom end of each of the conductive leads being connected to the upper electrodes at a corresponding position;
   forming a fourth dielectric layer on the third dielectric layer;
   forming a bottom electrode conductive contact hole and a plurality of upper electrode conductive contact holes in the fourth dielectric layer, a bottom end of the bottom electrode conductive contact hole being connected to the second conductive metal structure lead, and a bottom end of each of the upper electrode conductive contact holes being connected to the second conductive metal structure lead at a corresponding position;
   forming a fifth dielectric layer on the fourth dielectric layer; and
   forming a bottom electrode conductive lead and a plurality of upper electrode conductive leads in the fifth dielectric layer, a bottom end of the bottom electrode conductive lead being connected to the bottom electrode conductive contact hole, and the bottom of the upper electrode conductive lead being connected to an upper end of each of the upper electrode conductive contact holes;
   wherein constituent materials of the conductive lead, the plurality of upper electrode conductive leads, and the bottom electrode conductive lead comprise aluminum; and constituent materials within the upper electrode conductive contact hole and the bottom electrode conductive contact hole comprise tungsten.

* * * * *